US011973625B2

(12) United States Patent
Emira et al.

(10) Patent No.: US 11,973,625 B2
(45) Date of Patent: Apr. 30, 2024

(54) IQ CLOCK PHASE CALIBRATION

(71) Applicant: Shenzhen Goodix Technology Co., Ltd., Shenzhen (CN)

(72) Inventors: Ahmed Emira, San Diego, CA (US); Mohamed Aboudina, San Diego, CA (US); Faisal Hussien, San Diego, CA (US); Ayman Mohamed Elsayed, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/710,983

(22) Filed: Mar. 31, 2022

(65) Prior Publication Data

US 2023/0164010 A1 May 25, 2023

Related U.S. Application Data

(60) Provisional application No. 63/281,739, filed on Nov. 22, 2021.

(51) Int. Cl.
*H04L 27/20* (2006.01)
(52) U.S. Cl.
CPC .................................. *H04L 27/20* (2013.01)
(58) Field of Classification Search
CPC ..... H04L 27/18; H04L 27/20; H04L 27/2032; H04L 27/2042; H04L 27/2046; H04L 27/205; H04L 27/2053; H04L 27/2057; H04L 27/206; H04L 27/2067

USPC .............. 375/269, 279–281, 284, 308; 332/103–105, 146

See application file for complete search history.

(56) References Cited

U.S. PATENT DOCUMENTS

| | | | |
|---|---|---|---|
| 9,503,066 B2 * | 11/2016 | Ma | H03K 19/003 |
| 11,438,199 B1 * | 9/2022 | Xu | H04L 43/028 |
| 2008/0036509 A1 * | 2/2008 | Jang | H03K 5/135 327/141 |
| 2010/0002143 A1 * | 1/2010 | Wu | H04N 5/04 348/739 |
| 2013/0169330 A1 * | 7/2013 | Ma | H03K 5/1565 327/175 |
| 2014/0125394 A1 * | 5/2014 | Hood | H03K 5/13 327/237 |
| 2014/0368244 A1 * | 12/2014 | Ma | H03K 5/1565 327/170 |

(Continued)

*Primary Examiner* — Young T. Tse
(74) *Attorney, Agent, or Firm* — Kilpatrick Townsend & Stockton LLP

(57) ABSTRACT

A communication circuit is disclosed. The communication circuit includes a calibration system, configured to receive clock signals respectively having first and second clock phases, and first and second duty cycles, where the calibration system is further configured to receive input data and to adjust the input data to generate adjusted data based partly on the input data and based partly on the first and second duty cycles. The communication circuit also includes a mixer, configured to receive the clock signals and to receive the adjusted data, where the mixer is configured to generate output data based on the clock signals and the adjusted data, and where a mismatch in the output data caused by the first and second duty cycles being different is reduced because of the adjustment made to the input data to generate the adjusted data.

18 Claims, 4 Drawing Sheets

(56) References Cited

U.S. PATENT DOCUMENTS

| | | | |
|---|---|---|---|
| 2015/0065194 A1* | 3/2015 | Fong .................... | H03D 7/1483 |
| | | | 327/357 |
| 2020/0106430 A1* | 4/2020 | Martin ................. | G11C 7/1084 |
| 2021/0200257 A1* | 7/2021 | Huang ................. | H03C 3/0966 |

* cited by examiner

IQ CLOCK PHASE CALIBRATION

CROSS REFERENCE TO RELATED APPLICATIONS

This application claims priority to U.S. provisional patent application No. 63/281,739, titled "IQ CLOCK PHASE CALIBRATION," filed on Nov. 22, 2021, which is hereby incorporated by reference in their entirety for all purposes.

TECHNICAL FIELD

The subject matter described herein relates to IQ clock phase calibration, and more particularly to differential IQ clock phase calibration.

BACKGROUND

In typical transmitters and receivers with quadrature mixers, passive mixers with non-overlapping clocks are used to upconvert and downconvert the I and Q baseband phases to or from RF. In systems having four LO phases, the four LO phases ideally have exactly 90 phase shift from one another. The four LO phases may be generated using a divide-by-N phase generated, where, for example, N=2. Because of mismatches in the generation of the four LO phases the four LO phases have undesired phase mismatch. This phase mismatch will result in phase and magnitude mismatch in the upconverted or downconverted signal. Systems having reduced phase and magnitude mismatch are needed.

SUMMARY

One inventive aspect is a communication circuit, including a calibration system, configured to receive a plurality of clock signals each having a clock phase and a duty cycle, where a first clock signal has a first clock phase and a second clock signal has a second clock phase, where the first and second clock phases are different, where the first clock signal has a first duty cycle and the second clock signal has a second duty cycle, and where the first and second duty cycles are different, where the calibration system is further configured to receive input data and to adjust the input data to generate adjusted data based partly on the input data and based partly on the first and second duty cycles of the first and second clock signals. The communication circuit also includes a mixer, configured to receive the plurality of clock signals and to receive the adjusted data, where the mixer is configured to generate output data based on the plurality of clock signals and the adjusted data, and where a mismatch in the output data caused by the first and second duty cycles being different is reduced because of the adjustment made to the input data to generate the adjusted data.

In some embodiments, the communication circuit includes a frequency synthesizer, configured to generate the plurality of clock signals.

In some embodiments, the duty cycles of the plurality of clock signals or inverted versions of the plurality of clock signals are approximately 1 divided by the number of clock signals.

In some embodiments, the phases of the plurality of clock signals are separated in phase by substantially 360 degrees divided by the number of clock signals.

In some embodiments, the calibration system is configured to generate a plurality of analog values, each corresponding with a duty cycle of one of the plurality of clock signals.

In some embodiments, the calibration system is configured to generate a plurality of digital values, each corresponding with one of the analog values.

In some embodiments, the calibration system is configured to store the digital values, and to adjust the input data to generate adjusted data based partly on the analog values corresponding with the first and second duty cycles of the first and second clock signals.

Another inventive aspect is a method of operating a communication circuit, the communication circuit including a calibration system and a mixer, where the method includes: with the calibration system, receiving a plurality of clock signals each having a clock phase and a duty cycle, where a first clock signal has a first clock phase and a second clock signal has a second clock phase, where the first and second clock phases are different, where the first clock signal has a first duty cycle and the second clock signal has a second duty cycle, and where the first and second duty cycles are different. The method also includes, with the calibration system, receiving input data, with the calibration system, adjusting the input data to generate adjusted data based partly on the input data and based partly on the first and second duty cycles of the first and second clock signals, with the mixer, receiving the plurality of clock signals, with the mixer, receiving the adjusted data, and, with the mixer, generating output data based on the plurality of clock signals and the adjusted data, where a mismatch in the output data caused by the first and second duty cycles being different is reduced because of the adjustment made to the input data to generate the adjusted data.

In some embodiments, the communication circuit includes a frequency synthesizer, and the method further includes, with frequency synthesizer, generating the plurality of clock signals.

In some embodiments, the duty cycles of the plurality of clock signals or inverted versions of the plurality of clock signals are approximately equal to 1 divided by the number of clock signals.

In some embodiments, the phases of the plurality of clock signals are separated in phase by substantially 360 degrees divided by the number of clock signals.

In some embodiments, the method includes, with the calibration system, generating a plurality of analog values, each corresponding with a duty cycle of one of the plurality of clock signals.

In some embodiments, the method includes, with the calibration system, generating a plurality of digital values, each corresponding with one of the analog values.

In some embodiments, the method includes, with the calibration system, storing the digital values, where the input data is adjusted to generate the adjusted data based partly on the analog values corresponding with the first and second duty cycles of the first and second clock signals.

Another inventive aspect is a method of operating a communication circuit including a calibration system. The method includes, with the calibration system, receiving a plurality of clock signals each having a clock phase and a duty cycle, where a first clock signal has a first clock phase and a second clock signal has a second clock phase, where the first and second clock phases are different, where the first clock signal has a first duty cycle and the second clock signal has a second duty cycle, and where the first and second duty cycles are different. The method also includes, with the calibration system, generating a plurality of digital values, each corresponding with a duty cycle of one of the plurality of clock signals, and with the calibration system, storing the digital values.

In some embodiments, the method includes, with the calibration system, generating a plurality of analog values, each corresponding with a duty cycle of one of the plurality of clock signals, and with the calibration system, generating a plurality of digital values, each corresponding with one of the analog values.

In some embodiments, the method includes, with the calibration system, receiving input data, and with the calibration system, adjusting the input data to generate adjusted data based partly on the input data and based partly on the stored digital values.

In some embodiments, the communication circuit further includes a mixer, and the method further includes with the mixer, receiving the plurality of clock signals, with the mixer, receiving the adjusted data, and with the mixer, generating output data based on the plurality of clock signals and the adjusted data, where a mismatch in the output data caused by the duty cycles of the plurality of clock signals being different is reduced because of the adjustment made to the input data to generate the adjusted data.

In some embodiments, the communication circuit includes a frequency synthesizer, and the method further includes, with frequency synthesizer, generating the plurality of clock signals.

In some embodiments, the duty cycles of the plurality of clock signals or inverted versions of the plurality of clock signals are approximately equal to 1 divided by the number of clock signals, and the phases of the plurality of clock signals are separated in phase by substantially 360 degrees divided by the number of clock signals.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

As discussed in further detail below, embodiments discussed herein illustrate circuits and methods for generating and calibrating multiple clock phases.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figure 1:
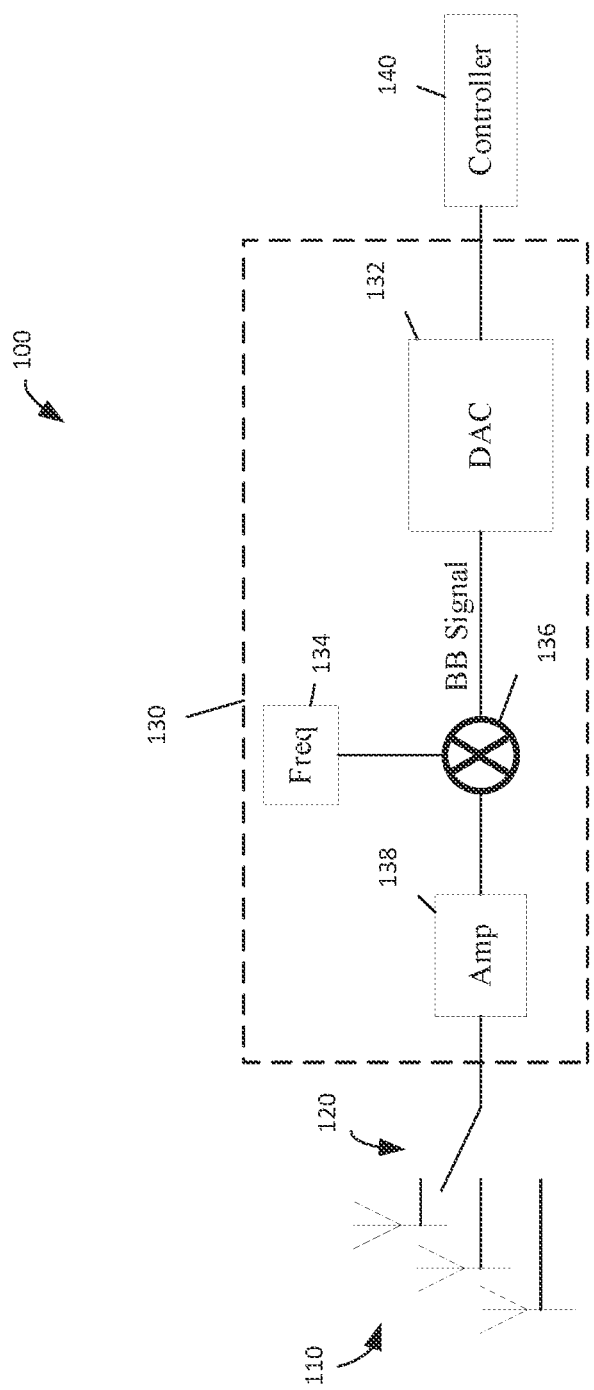
FIG. 1 is a schematic diagram of a transmitter circuit according to an embodiment.

FIG. 1 is a schematic diagram of a transmitter circuit 100 according to an embodiment. Transmitter circuit 100 includes antenna or antenna array 110, switch 120, RF chain 130, and controller 140. Transmitter circuit 100 illustrates a particular example. Other embodiments of transmitter circuits may be used.

Antenna or antenna array 110 may be any antenna or antenna array. For example, in some embodiments, antenna or antenna array 110 includes 1, 2, 3, 4, or more antennas. In some embodiments, antenna or antenna array 110 includes a linear antenna array. In some embodiments, antenna or antenna array 110 includes a two dimensional antenna array, for example, having multiple rows of linear antenna arrays.

In embodiments where antenna or antenna array 110 includes one antenna, the one antenna may be connected directly to RF chain 130, and switch 120 may be omitted. In embodiments where antenna or antenna array 110 includes multiple antennas, each antenna may be directly connected to a separate RF chain. Each of the RF chains may have the features of RF chain 130.

Antenna or antenna array 110 may be configured to transmit RF signals to a receiver circuit. The RF signals include a high frequency signal at a carrier frequency modulated with a low frequency information signal. The high frequency signal is transmitted by one of the antennas from antenna or antenna array 110, for example, according to a programmable electrical connection formed by switch 120, as controlled by controller 140.

Controller 140 is configured to provide a digital signal to RF chain 130, where the digital signal encodes the information signal to be transmitted by antenna or antenna array 110.

RF chain 130 includes digital to analog converter circuit (DAC) 132, mixer 136, frequency synthesizer 134, and power amplifier (PA) 138. RF chain 130 is an example only, and embodiments of other RF chains may alternatively be used. For example, in some embodiments, one or more amplifiers, and/or filters may be included, as understood by those of skill in the art.

The digital signal is processed by the digital to analog converter 132 to generate an analog baseband signal (BB signal) representing the digital signal, using techniques known in the art. Various digital to analog converter structures known in the art may be used.

Mixer 136 receives the analog baseband signal output from the digital to analog converter 132 and an oscillator signal at the carrier frequency generated by frequency synthesizer 134. In response to the analog baseband signal and the oscillator signal, mixer 136 up converts the analog baseband signal from the analog-to-digital converter 132 to a high frequency signal, using techniques known in the art. Various mixer structures known in the art may be used. The resulting high frequency signal is at the carrier frequency in this modulated so as to include the information of the low frequency information signal.

Power amplifier 138 is configured to receive the high frequency signal and to drive the high frequency signal to one of the antennas from antenna or antenna array 110, for example, according to a programmable electrical connection formed by switch 120, as controlled by controller 140. The power amplifier 138 drives the high frequency signal to one of the antennas using techniques known in the art. Various power amplifier structures known in the art may be used.

As understood by those of skill in the art, using communication connectivity not illustrated in FIG. 1, control signals from controller 140 may control certain variable functionality of switch 120, power amplifier 138, frequency synthesizer 134, mixer 136, and digital to analog converter 132, for example, as understood by those of skill in the art.

The control signals from controller 140 may, for example, control switch 120 to control which of multiple antennas RF chain 130 drives the high frequency signal with.

In embodiments having multiple antennas each connected to one of multiple RF chains, controller 140 may generate control signals for each of the RF chains.

Figures 2, 3:
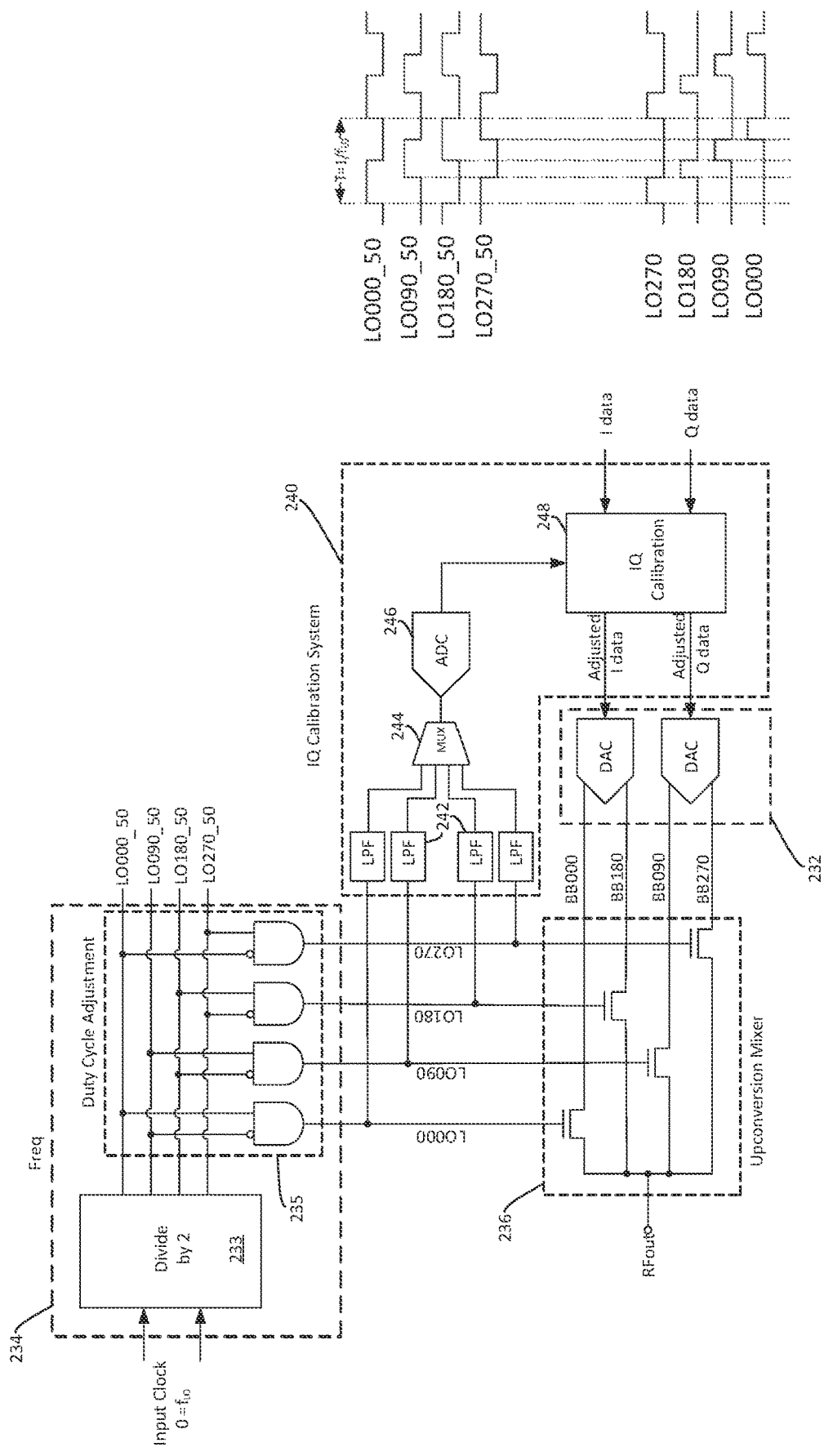
FIG. 2 illustrates a schematic diagram of a portion of a transmitter circuit.
FIG. 3 illustrates a timing diagram of certain clock phase signals of the circuit of FIG. 2.

FIG. 2 illustrates a schematic diagram of a portion of a transmitter circuit, such as that illustrated in FIG. 1. In the illustrated embodiment, the portion of the transmitter circuit includes a frequency synthesizer 234, a mixer 236, a DAC circuit 232, and an IQ calibration system 240.

In the illustrated embodiment, frequency synthesizer 234, which may be similar or identical to frequency synthesizer 134 of FIG. 1, includes a divide by 2 circuit 233 and a duty cycle adjustment circuit 235. In alternative embodiments, other circuits and/or architectures are used. In this embodiment the frequency synthesizer 234 is configured to generate four clock phases offset by approximately 90 degrees from one another. In some embodiments, a different number of clock phases are generated, offset, for example, by an approximately fixed angle, where, for example, the number of phases times the fixed angle is equal to 360 degrees. In this embodiment, the generated clock phases are used by a particular mixer 236. In some embodiments, other mixers or other circuits may be used. In this embodiment, the mixer 236 is an upconversion mixer 236 of a transmitter circuit, and may have features similar or identical to mixer 136 of FIG. 1.

As illustrated, in this embodiment, the divide by two circuit 233 receives a differential clock signal, for example, generated at least partly with a local oscillator circuit. In addition, as shown in FIG. 3, the divide by two circuit 233 generates four initial clock phases LO000_50, LO090_50, LO180_50, and LO270_50, where the four initial clock phases LO000_50, LO090_50, LO180_50, and LO270_50 each have a frequency equal to $f_{Lo}$ and approximately 50% duty cycle. Any divide by two circuit architecture may be used.

As illustrated, in this embodiment, the duty cycle adjustment circuit 235 receives the four initial clock phases LO000_50, LO090_50, LO180_50, and LO270_50. In addition, as shown in FIG. 3, the duty cycle adjustment circuit 235 generates four mixer clock phases LO000, LO090, LO180, and LO270, where the four mixer clock phases LO000, LO090, LO180, and LO270 each have a frequency equal to $f_{LO}$ and duty cycles which are near 25% (one divided by the number of mixer clock phases).

In the illustrated embodiment, the duty cycle adjustment circuit 235 includes an architecture which performs four inversion and four logical AND operations. In some embodiments, different duty cycle adjustment circuit architectures are used.

As illustrated in FIG. 3, because of mismatches in the delays of the circuits used to generate the four mixer clock phases LO000, LO090, LO180, and LO270, the four mixer clock phases LO000, LO090, LO180, and LO270 have duty cycles, which, although near 25%, differ such that, when used by the upconversion mixer, unless compensated for, the RFOut signal includes significant phase and magnitude mismatch because of the differing duty cycles, as understood by those of skill in the art.

As illustrated in FIG. 2, the IQ calibration system 240 includes an IQ calibration circuit 248, and a duty cycle detection circuit comprising a low pass filter 242 for each clock phase, a multiplexor circuit 244, and an ADC 246.

Each low pass filter 242 is configured to receive one of the clock phases, and to generate an analog signal corresponding to the average analog value of the received clock phase. In response to a signal from a controller (not shown), the multiplexor circuit 244 is configured to connect the input of the ADC 246 to one of the low-pass filters. A digital representation of the analog signal from the low-pass filter connected thereto, and to provide the digital representation to the IQ calibration circuit 248.

The IQ calibration circuit 248 is configured to store the digital representations of the analog signals of the low-pass filters. In addition, the IQ calibration circuit 248 is configured to receive I and Q input data, for example, from the controller, and to generate adjusted I and Q data, which are converted to analog signals by DAC circuit 232 for the up conversion mixer. As discussed in more detail below, the adjusted I and Q data is generated based on the I and Q input data and based on the stored digital representations of the analog signals of the low-pass filters. As discussed in more detail below, the adjusted I and Q data is generated so that the RFOut signal includes no or significantly less phase and magnitude mismatch caused by the differing duty cycles of the four mixer clock phases LO000, LO090, LO180, and LO270.

RFOut Phase and Magnitude Error from Mixer Clock Phase Duty Cycle Mismatch

The high time durations of the mixer clock phases LO000, LO090, LO180, and LO270 are respectively:

T1=T0/4+te1,

T2=T0/4+te2,

T3=T0/4+te3, and

T4=T0/4+te4, where te1, te2, te3, and te4 are the respective errors in the high time durations of the mixer clock phases LO000, LO090, LO180, and LO270. In some embodiments, te1+te2+te3+te4=0.

Figure 6:
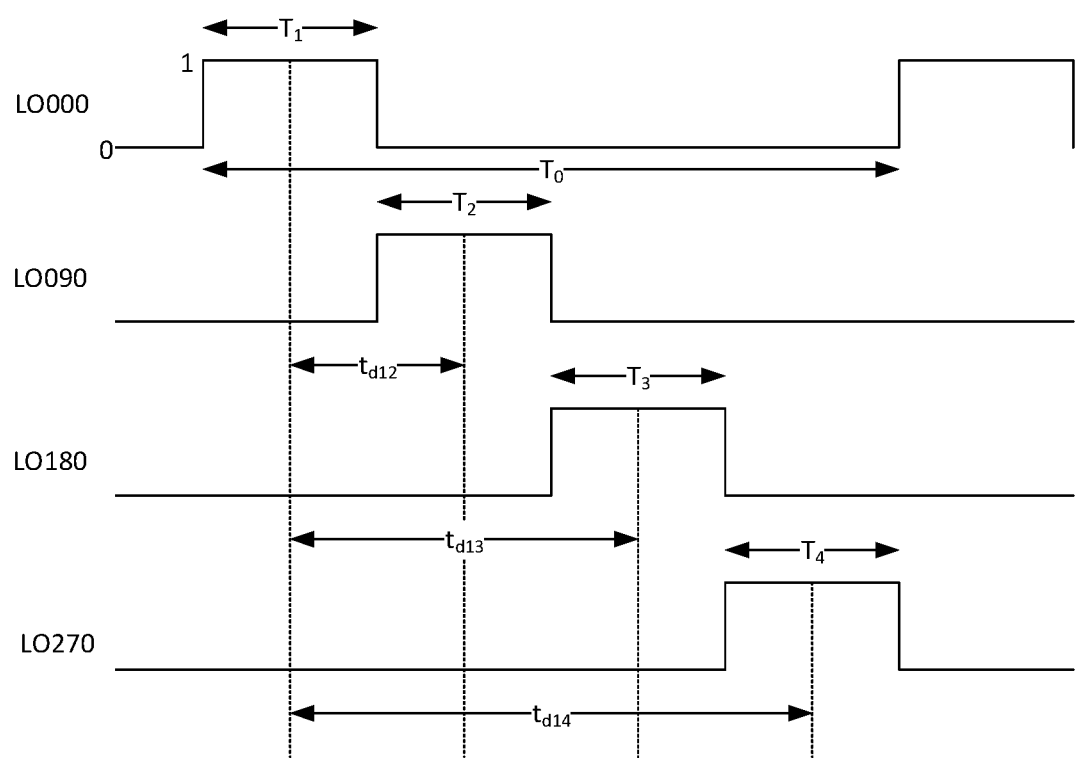
FIG. 6 illustrates example time durations between adjacent high time centers of the mixer clock phases.

The time durations between adjacent high time centers of the mixer clock phases LO000, LO090, LO180, and LO270 are respectively:

td12=T0/4+(te1+te2)/2 td13=T0/2+(te1+2te2+te3)/2 td14=3 T0/4+(te1+2te2+2te3+te4)/2=3T0/4+(te2+te3)/2, where td12, td13, and td14 are illustrated in FIG. 6.

The amplitude and phase equations are as follows:

| | Amplitude | Phase |
|---|---|---|
| LO000 | $\frac{2}{\pi}\sin\left(\frac{\pi}{4}+\pi\frac{t_{e1}}{T_0}\right)$ | 0 |
| LO090 | $\frac{2}{\pi}\sin\left(\frac{\pi}{4}+\pi\frac{t_{e2}}{T_0}\right)$ | $\frac{\pi}{2}+\pi\left(\frac{t_{e1}+t_{e2}}{T_0}\right)$ |
| LO180 | $\frac{2}{\pi}\sin\left(\frac{\pi}{4}+\pi\frac{t_{e3}}{T_0}\right)$ | $\pi+\pi\left(\frac{t_{e1}+2t_{e2}+t_{e3}}{T_0}\right)$ |
| LO270 | $\frac{2}{\pi}\sin\left(\frac{\pi}{4}+\pi\frac{t_{e4}}{T_0}\right)$ | $\frac{3\pi}{2}+\pi\left(\frac{t_{e2}+t_{e3}}{T_0}\right)$ |

Approximate amplitude and phase equations are as follows:

| | Amplitude | Phase |
|---|---|---|
| LO000 | $\frac{\sqrt{2}}{\pi}\left(1+\pi\frac{t_{e1}}{T_0}\right)$ | 0 |
| LO090 | $\frac{\sqrt{2}}{\pi}\left(1+\pi\frac{t_{e2}}{T_0}\right)$ | $\frac{\pi}{2}+\pi\left(\frac{t_{e1}+t_{e2}}{T_0}\right)$ |
| LO180 | $\frac{\sqrt{2}}{\pi}\left(1+\pi\frac{t_{e3}}{T_0}\right)$ | $\pi+\pi\left(\frac{t_{e1}+2t_{e2}+t_{e3}}{T_0}\right)$ |
| LO270 | $\frac{\sqrt{2}}{\pi}\left(1+\pi\frac{t_{e4}}{T_0}\right)$ | $\frac{3\pi}{2}+\pi\left(\frac{t_{e2}+t_{e3}}{T_0}\right)$ |

Approximate IQ Cartesian equations are as follows:

| | Amplitude | Phase |
|---|---|---|
| LO000 | $\frac{\sqrt{2}}{\pi}\left(1+\pi\frac{t_{e1}}{T_0}\right)$ | 0 |
| LO090 | $\frac{\sqrt{2}}{\pi}\left(1+\pi\frac{t_{e2}}{T_0}\right)$ | $\frac{\pi}{2}+\pi\left(\frac{t_{e1}+t_{e2}}{T_0}\right)$ |
| LO180 | $\frac{\sqrt{2}}{\pi}\left(1+\pi\frac{t_{e3}}{T_0}\right)$ | $\pi+\pi\left(\frac{t_{e1}+2t_{e2}+t_{e3}}{T_0}\right)$ |
| LO270 | $\frac{\sqrt{2}}{\pi}\left(1+\pi\frac{t_{e4}}{T_0}\right)$ | $\frac{3\pi}{2}+\pi\left(\frac{t_{e2}+t_{e3}}{T_0}\right)$ |

Approximate IQ Differential Cartesian equations are as follows:

| | Real | Imaginary |
|---|---|---|
| LO000-LO180 | $\frac{2\sqrt{2}}{\pi}+\sqrt{2}\frac{t_{e1}+t_{e3}}{T_0}$ | $\sqrt{2}\left(\frac{t_{e1}+2t_{e2}+t_{e3}}{T_0}\right)$ |
| LO090-LO270 | $-\sqrt{2}\left(\frac{t_{e1}+2t_{e2}+t_{e3}}{T_0}\right)$ | $\frac{2\sqrt{2}}{\pi}+\sqrt{2}\frac{t_{e2}+t_{e4}}{T_0}$ |

Approximate IQ Differential amplitude and phase equations are as follows:

| | Amplitude | Phase |
|---|---|---|
| LO000-LO180 | $\frac{2\sqrt{2}}{\pi}+\sqrt{2}\frac{t_{e1}+t_{e3}}{T_0}$ | $\frac{\pi}{2}\left(\frac{t_{e1}+2t_{e2}+t_{e3}}{T_0}\right)$ |
| LO090-LO270 | $\frac{2\sqrt{2}}{\pi}+\sqrt{2}\frac{t_{e2}+t_{e4}}{T_0}$ | $-\frac{\pi}{2}+\frac{\pi}{2}\left(\frac{t_{e1}+2t_{e2}+t_{e3}}{T_0}\right)$ |

Approximate I and Q amplitude and phase mismatch equations are as follows:

| | Amplitude | Phase |
|---|---|---|
| Mismatch | $\frac{1-\frac{\pi}{2}\frac{t_{e2}+t_{e4}}{T_0}}{1+\frac{\pi}{2}\frac{t_{e1}+t_{e3}}{T_0}}-1$ | 0 |

In some embodiments, IQ Differential amplitude and phase equations may be calculated as follows:

LO_I=LO000–LO180

LO_Q=LO090–LO270

The ratio of the I and Q phases is represented as a complex number with real value R and imaginary value X.

$$\frac{LO000-LO180}{LO090-LO270}=\frac{LO\_I}{LO\_Q}=R+jX$$

The amplitude and phase mismatch cam then be calculated as:

| | Amplitude | Phase |
|---|---|---|
| Mismatch | $\epsilon = |R+jX|-1$ | $\theta = \tan^{-1}\left(\frac{X}{R}\right)+90$ |

Accordingly, in some embodiments, the IQ calibration circuit 248 is configured to respectively determine errors te1, te2, te3, and te4 based on the corresponding digital representation of the corresponding analog signal from the corresponding low-pass filter. The IQ calibration circuit 248 is further configured to generate the adjusted I and Q data for the up conversion mixer according to the amplitude mismatch equation indicated above.

The corrected complex baseband signal can expressed as:

$$BB_{corrected}=A(1+\epsilon)e^{-i(\phi+\theta)}=BB(1+\epsilon)e^{-i(\theta)},$$

where A and Φ are the amplitude and phase of BB data before correction. The I and Q corrected phase are obtained by taking the real and imaginary parts of BB_corrected.

In some embodiments, different, for example, more or less accurate I and Q amplitude and phase mismatch equations may be used, where the IQ calibration circuit 248 is correspondingly configured to generate differential adjusted I and Q data based on the different I and Q amplitude and phase mismatch equations. In some embodiments, the different I and Q amplitude and phase mismatch equations are based on amplitude and phase equations based on other approximations and which are more or less accurate than those shown above. In some embodiments, the different I and Q amplitude and phase mismatch equations are based partly on one or more circuit or circuit performance parameters of the IQ calibration system 240 circuitry. For example, the different I and Q amplitude and phase mismatch equations may be based partly on a resistance and/or a capacitance parameter of the low-pass filters.

Figures 4, 5:
FIG. 4 is a flowchart diagram of a method of calibrating the IQ calibration system, according to an embodiment.
FIG. 5 is a flowchart diagram of a method of transmitting data, according to an embodiment.

FIG. 4 is a flowchart diagram of a method 400 of calibrating the IQ calibration system 240, according to an embodiment. The method 400 may be performed by a transmitter circuit, such as transmitter 100 of FIG. 1. In some embodiments, a controller of the transmitter has instructions stored therein which, when executed, cause the transmitter to perform the method 400.

At 410, the controller sends a connect signal to multiplexor 244 to cause multiplexor 244 to electrically connect a first or another of the LPFs 242 to the ADC 246. The connect signal encodes an identification of which of the LPFs 242 is to be electrically connected to the ADC 246. In response to the connect signal, the multiplexor 244 electrically connects the identified LPF 242 to the ADC 246.

At 420, the ADC 246 receives a voltage from the LPF electrically connected thereto. In addition, the controller sends a convert signal to the ADC 246. In response to the convert signal, the ADC 246 converts the received voltage from the electrically connected LPF 242 to a digital value encoding the analog value of the received voltage. In some embodiments, the controller waits at least a predetermined delay time after sending the connect signal to multiplexor 244 before sending the convert signal to ADC 246. During the delay time, the voltage at the input of ADC 246 settles to a value corresponding with the average duty cycle of the clock signal received by the LPF 242 connected to the ADC 246 through multiplexor 244.

At 430, the ADC 246 provides the digital value to the IQ calibration circuit 248.

At 440, the controller sends a store signal to IQ calibration circuit 248. In response to the store signal, IQ calibration circuit 248 causes the digital value to be stored in a digital memory.

At 450, the controller determines whether to connect the ADC 246 to another LPF 242. The determination may be made, for example, based on whether the IQ calibration circuit 248 has stored digital values for each of the LPFs 242. For example, if the IQ calibration circuit 248 has not stored a digital value for at least one of the LPFs 242, the controller may determine that one of the LPFs for which a digital value has not been stored is to be connected to the ADC 246. In contrast, if the IQ calibration circuit has stored a digital value for all of the LPFs 242, the controller may determine to not connect the ADC 246 to another LPF 242.

If, at 450, the controller determines to connect the ADC 246 to another LPF 242, and another occurrence of 410, the controller sends a connect signal to multiplexor 244 to cause multiplexor 244 to electrically connect a first or another of the LPFs 242 to the ADC 246. Otherwise, if, at 450, the controller determines do not connect the ADC to another LPF 242, method 400 ends.

Following the performance of method 400, the controller may cause the transmitter to transmit data modified by IQ calibration circuit 248 using the stored digital values according to various aspects discussed above and/or according to method 500, discussed with reference to FIG. 5.

FIG. 5 is a flowchart diagram of a method 500 of transmitting data, according to an embodiment. The method 500 may be performed by a transmitter circuit, such as transmitter 100 of FIG. 1. In some embodiments, a controller of the transmitter has instructions stored therein which, when executed, cause the transmitter to perform the method 500.

At 510, an IQ calibration circuit 248 receives input data, for example, from the controller. For example, the IQ calibration circuit 248 may receive I and Q input data from the controller.

At 520, the IQ calibration circuit 248 accesses stored data representing duty cycle information of s clock signals to be used by mixer 236. In some embodiments, the stored data representing duty cycle information was stored using a method similar or identical to method 400.

At 530, the IQ calibration circuit generates adjusted data based partly on the input data received at 510 and based partly on the duty cycle information accessed at 520.

At 540, DAC circuit 232 receives the adjusted data from the IQ calibration circuit 248, and generates analog signals based on the received adjusted data.

At 550, DAC circuit 232 provides the analog signals to mixer 236.

At 560, mixer 236 receives the analog signals from DAC circuit 232, and receives clock signals from a frequency synthesizer 234, where the duty cycle information accessed at 520, corresponds with and characterizes the duty cycles of the clock signals. In addition, mixer 236 of converts the analog signals from DAC circuit 232 in response to the received clock signals to generate output data, for example, to be provided to an amplifier, such as amplifier 138 of transmitter 100. A mismatch in the output data caused by the duty cycles of the clock signals being different is reduced because of the adjustment made to the input data to generate the adjusted data.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, 13, and C;" "one or more of A, 13, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A communication circuit, comprising:
  a calibration system, configured to receive a plurality of clock signals each having a clock phase and a duty cycle, wherein a first clock signal has a first clock phase and a second clock signal has a second clock phase, wherein the first and second clock phases are different, wherein the first clock signal has a first duty cycle and the second clock signal has a second duty cycle, and wherein the first and second duty cycles are different, wherein the calibration system is further configured to receive input data and to adjust the input data to generate adjusted data based partly on the input data and based partly on the first and second duty cycles of the first and second clock signals; and
  a mixer, configured to receive the plurality of clock signals and to receive the adjusted data, wherein the mixer is configured to generate output data based on the plurality of clock signals and the adjusted data, and wherein a mismatch in the output data caused by the first and second duty cycles being different is reduced because of the adjustment made to the input data to generate the adjusted data.

2. The communication circuit of claim 1, further comprising a frequency synthesizer, configured to generate the plurality of clock signals.

3. The communication circuit of claim 1, wherein the duty cycles of the plurality of clock signals or inverted versions of the plurality of clock signals are approximately 1 divided by a number of the plurality of clock signals.

4. The communication circuit of claim 1, wherein the phases of the plurality of clock signals are separated in phase by substantially 360 degrees divided by a number of the plurality of clock signals.

5. The communication circuit of claim 1, wherein the calibration system is configured to generate a plurality of analog values, each corresponding with a duty cycle of one of the plurality of clock signals.

6. The communication circuit of claim 5, wherein the calibration system is configured to generate a plurality of digital values, each corresponding with one of the analog values.

7. The communication circuit of claim 6, wherein the calibration system is configured to store the digital values, and to adjust the input data to generate the adjusted data based partly on the analog values corresponding with the first and second duty cycles of the first and second clock signals.

8. A method of operating a communication circuit, the communication circuit comprising a calibration system and a mixer, wherein the method comprises:
  with the calibration system, receiving a plurality of clock signals each having a clock phase and a duty cycle, wherein a first clock signal has a first clock phase and a second clock signal has a second clock phase, wherein the first and second clock phases are different, wherein the first clock signal has a first duty cycle and the second clock signal has a second duty cycle, and wherein the first and second duty cycles are different;
  with the calibration system, receiving input data;
  with the calibration system, adjusting the input data to generate adjusted data based partly on the input data and based partly on the first and second duty cycles of the first and second clock signals;

with the mixer, receiving the plurality of clock signals;
with the mixer, receiving the adjusted data; and
with the mixer, generating output data based on the plurality of clock signals and the adjusted data, wherein a mismatch in the output data caused by the first and second duty cycles being different is reduced because of the adjustment made to the input data to generate the adjusted data.

9. The method of claim 8, wherein the communication circuit further comprises a frequency synthesizer, and the method further comprises, with the frequency synthesizer, generating the plurality of clock signals.

10. The method of claim 8, wherein the duty cycles of the plurality of clock signals or inverted versions of the plurality of clock signals are approximately equal to 1 divided by a number of the plurality of clock signals.

11. The method of claim 8, wherein the phases of the plurality of clock signals are separated in phase by substantially 360 degrees divided by a number of the plurality of clock signals.

12. The method of claim 8, further comprising, with the calibration system, generating a plurality of analog values, each corresponding with a duty cycle of one of the plurality of clock signals.

13. The method of claim 12, further comprising, with the calibration system, generating a plurality of digital values, each corresponding with one of the analog values.

14. The method of claim 13, further comprising, with the calibration system, storing the digital values, wherein the input data is adjusted to generate the adjusted data based partly on the analog values corresponding with the first and second duty cycles of the first and second clock signals.

15. A method of operating a communication circuit comprising a calibration system and a mixer, wherein the method comprises:
with the calibration system and with the mixer, receiving a plurality of clock signals each having a clock phase and a duty cycle, wherein a first clock signal has a first clock phase and a second clock signal has a second clock phase, wherein the first and second clock phases are different, wherein the first clock signal has a first duty cycle and the second clock signal has a second duty cycle, and wherein the first and second duty cycles are different;
with the calibration system, generating a plurality of digital values, each corresponding with a duty cycle of one of the plurality of clock signals;
with the calibration system, storing the digital values;
with the calibration system, receiving input data and adjusting the input data to generate adjusted data based partly on the input data and based partly on the stored digital values; and
with the mixer, receiving the adjusted data and generating output data based on the plurality of clock signals and the adjusted data, wherein a mismatch in the output data caused by the duty cycles of the plurality of clock signals being different is reduced because of the adjustment made to the input data to generate the adjusted data.

16. The method of claim 15, further comprising:
with the calibration system, generating a plurality of analog values, each corresponding with the duty cycle of one of the plurality of clock signals; and
with the calibration system, generating the plurality of digital values, each corresponding with one of the analog values.

17. The method of claim 15, wherein the communication circuit further comprises a frequency synthesizer, and the method further comprises, with the frequency synthesizer, generating the plurality of clock signals.

18. The method of claim 15, wherein duty cycles of the plurality of clock signals or inverted versions of the plurality of clock signals are approximately equal to 1 divided by a number of the plurality of clock signals, and wherein the phases of the plurality of clock signals are separated in phase by substantially 360 degrees divided by the number of the plurality of clock signals.

* * * * *